United States Patent [19]
Grant et al.

[11] Patent Number: 5,247,954
[45] Date of Patent: Sep. 28, 1993

[54] MEGASONIC CLEANING SYSTEM

[75] Inventors: Robert W. Grant, Excelsior; Richard E. Novak, Plymouth, both of Minn.

[73] Assignee: SubMicron Systems, Inc., Allentown, Pa.

[21] Appl. No.: 791,094

[22] Filed: Nov. 12, 1991

[51] Int. Cl.$^5$ ............................................. B08B 3/12
[52] U.S. Cl. ........................................ 134/184; 134/1; 310/335; 366/127
[58] Field of Search ................... 134/1, 184; 366/127; 68/355; 310/335, 337, 348, 354

[56] References Cited
U.S. PATENT DOCUMENTS

| | | | |
|---|---|---|---|
| 2,934,661 | 4/1960 | Chambers | 310/354 |
| 3,596,883 | 8/1971 | Brech | 134/184 X |
| 4,998,549 | 3/1991 | Bran | 134/184 |

Primary Examiner—Philip R. Coe
Attorney, Agent, or Firm—Hugh D. Jaeger

[57] ABSTRACT

Megasonic cleaning system for use in cleaning of electronic or other items such as semiconductor wafers or semiconductor substrates in a wafer carrier. Formed piezoelectric transducers are bonded to a tubular envelope at a low temperature and are excited at a first frequency or a second higher frequency for cleaning of items in a cleaning tank. A novel sealing assembly accommodates tubular envelopes of varying diameters.

2 Claims, 4 Drawing Sheets

MEGASONIC CLEANING SYSTEM

BACKGROUND OF THE INVENTION

1. Field of the Invention

The present invention pertains to a megasonic cleaning tank, and more particularly, pertains to a tank using two or more megasonic frequencies for cleaning of items, such as wafer chips. A unique transducer assembly generates the energy.

2. Description of the Prior Art

Ultrasonic frequencies have been used for a long time to cause cavitation in cleaning solutions. These frequencies have been in the thousand kilohertz or low hundred thousand kilohertz ranges. In recent years, higher frequencies have been used to affect the cleaning efficiencies of smaller particles in the submicron range. The frequencies called "megasonic" are generally understood to be in the range of one megahertz. However, use of a single megasonic frequency has not proved to be a "cure" for cleaning objects where different sizes of contaminates or particulates were abundant.

Also, in the past, the piezoelectric devices have been silvered, and epoxied onto a metal or quartz envelope. Epoxy bonding of a piezoelectric device to a sapphire or quartz mount has not, however, proven to be a good method for the following reason. Bubbles in the epoxy which were present in set-up or during use impede the sonic wave propagation. This in turn causes areas of non-cleaning to occur. The epoxy is a poor heat conductor which in use allows the piezoelectric ceramic device to heat up, which reduces the power output of the system.

Until now, quartz lenses have been used to shape the waves emitting from the transducers into the process tank. These are expensive to grind, and are generally fragile. The prior art transducers have been generally flat, and mounted on a flat "window".

The present invention overcomes the deficiencies of the prior art by providing a method of running a piezoelectric device at two distinct frequencies to further improve the cleaning efficiency wherein particles of a smaller diameter are affected by higher or different frequencies. Also provided is a method of low temperature bonding of the piezoelectric transducers to an inert envelope without the use of epoxy which allows use in ultra-high purity cleaning applications with higher cleaning reliability.

SUMMARY OF THE INVENTION

The general purpose of the present invention is to provide a megasonic cleaner. Formed piezoelectric ceramic transducers bonded by a low temperature process to a tubular envelope transmits megasonic waves using different frequencies to effect cleaning of items, such as semiconductor wafers or semiconductor substrates in a tank. A cylindrical envelope passes through the walls of the tank and is sealed therein by a sealing assembly which includes an angled mounting collar.

According to one embodiment of the present invention, there is a tubular envelope which passes through two sides of a cleaning tank. Alternating formed piezoelectric ceramic transducers are bonded to the inside of the tubular envelope and transmit megasonic waves at different frequencies. An angled mounting collar with a seal and O-rings seals the ends of the tubular envelope to the tank ends by means of a cap which exerts pressure thereupon to appropriately compress the O-rings to effect a seal.

One significant aspect and feature of the present invention is a megasonic cleaner which uses two different megasonic frequencies.

Another significant aspect and feature of the present invention is piezoelectric ceramic transducers bonded to a tubular envelope by a low temperature method.

A further significant aspect and feature of the present invention is the use of an angled mounting collar and O-rings to accommodate tubular envelopes of varying diameters.

Having thus described the embodiments of the present invention, it is the principal object hereof to provide a megasonic cleaner.

One object of the present invention is unique mounting of the piezoelectric transducers for optimizing energy transfer.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
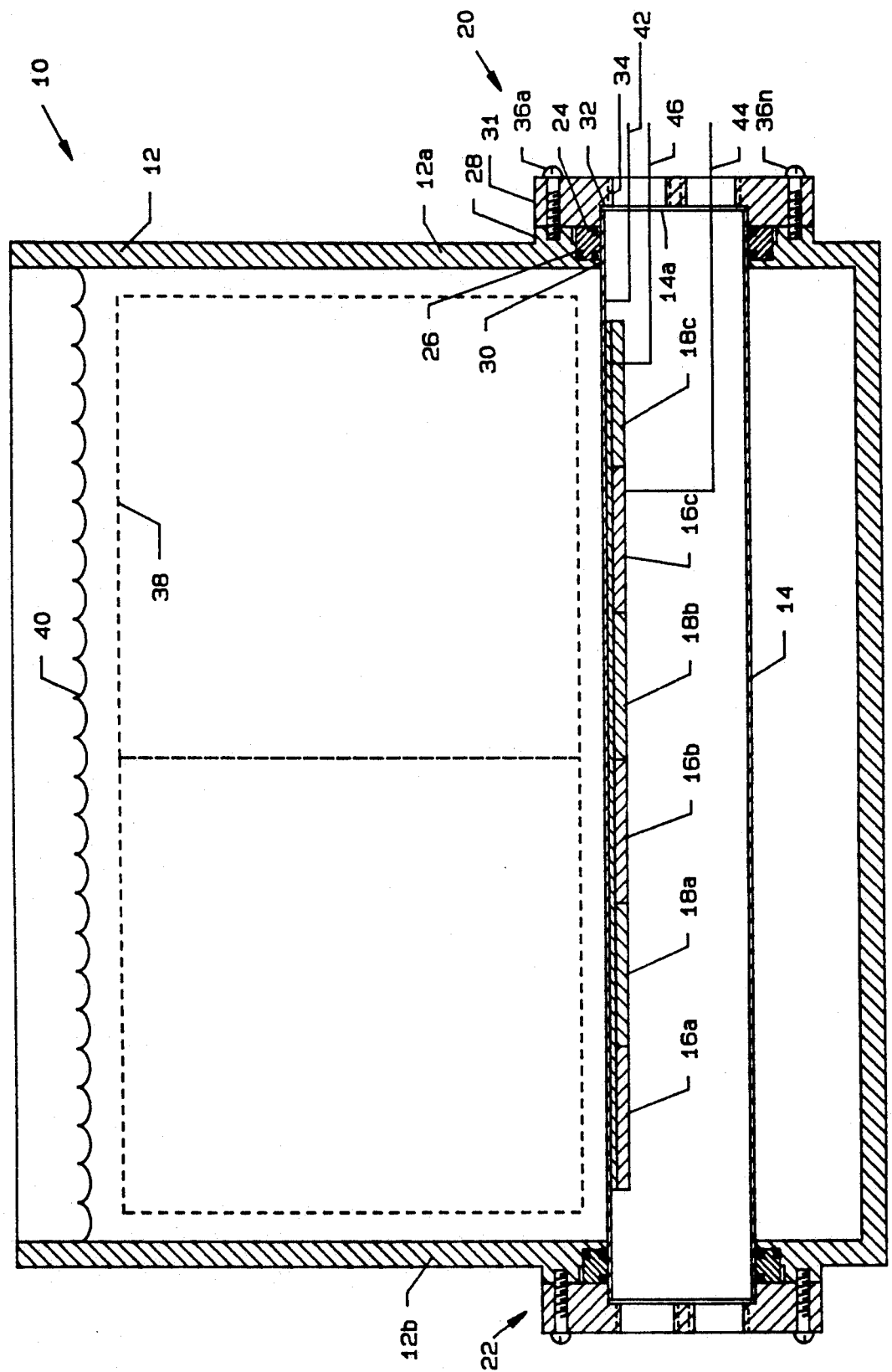
FIG. 1 illustrates a side view in cross section of a megasonic cleaner.

FIG. 1 illustrates a sectional view of a megasonic cleaner 10, the present invention, including a tank 12, a tubular envelope 14 engaged to and extending through the ends 12a and 12b of the tank 12, a plurality of staggered piezoelectric ceramic transducers 16a-16c and 18a-18c bonded to an upper interior surface of the tubular envelope 14. Like sealing assemblies 20 and 22 aligned over and about the ends of the tubular ceramic envelope 14. Sealing assembly 20 includes an annular angled mounting collar 24 aligned in an annular recess 26 in the tank end 12a. An annular raised shoulder 28 protrudes from the tank end 12a and aligns concentrically with the recess 26 and also with an orifice 30 in the tank end 12a. A cap 31 has an annular shoulder 32, annular surface 33 and central concentric orifice 34 aligned over the end 14a of the tubular envelope 14 and also against the angled mounting collar 24. A plurality of fasteners 36a-36n secures the cap 31 to the annular raised shoulder 28. Seals and O-rings complete the seal and are described later in FIG. 5. A wafer carrier 38 is immersed in a semiconductor cleaning fluid 40.

Wire 42 secures electrically to the tubular ceramic envelope 14 and wires 44 and 46 secure electrically to the piezoelectric ceramic transducers 16a-16c and 18a-18c, respectively, for excitation and subsequent cleaning action on a multiple frequency basis through the semiconductor cleaning fluid 40. The piezoelectric ceramic transducers 16a–16c and 18a–18c operate in the area of 1.5 megahertz and 0.75 megahertz.

Figure 2:
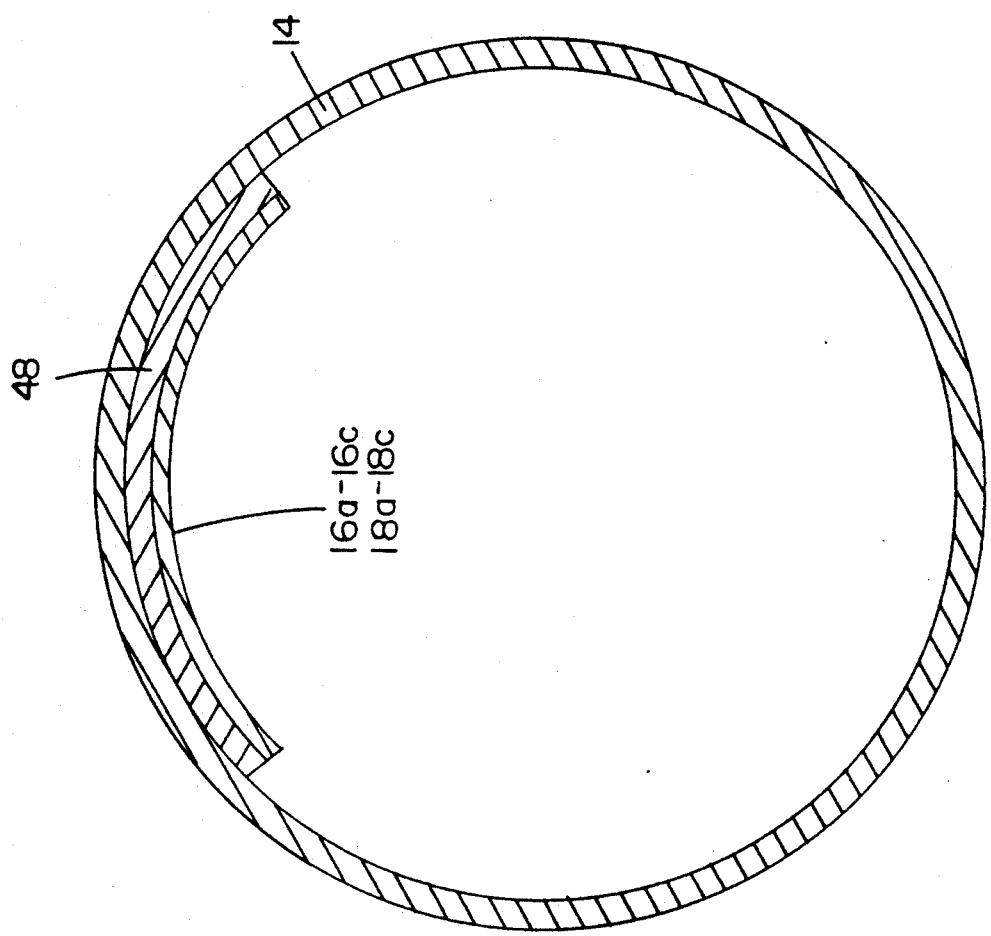
FIG. 2 illustrates an end view of the tubular envelope.

FIG. 2 illustrates an end view of the tubular envelope 14 in cross section including a general view of the piezoelectric ceramic transducers 16a–16c and 18a–18c where all numerals correspond to those elements previously described. The method of bonding of the piezoelectric ceramic transducers 16a–16c and 18a–18c to the tubular envelope 14 takes advantage of the fact that the transducer material has a critical temperature of 600° C. (a de-poling temperature) which must not be approached. A bonding procedure which does not exceed 250° C. is used in the mounting procedure. In order to use a metal to ceramic mounting procedure, which will eliminate the mentioned faults in the older prior art epoxy mounting method, a low temperature brazing alloy is used to bond between the silvered piezoelectric ceramic transducers 16a–16c and 18a–18c and the metalized surface of the inside diameter of the tubular envelope 14, which can be ceramic or sapphire. This solder 48 is a pre-formed 96.5% tin, 3.5% silver, and melts at about 221° C. This solder 48 sticks to both the silver and the silver/tungsten, which is fired onto the inside of the tubular envelope 14. The solder 48 is applied to a 0.01 inch thickness. This is further "fluxed" with a nickel chloride or a rosin-based flux. The firing of the tubular envelope metalization is performed first. This firing step is done at about 1300° C., and does not affect the piezoelectric ceramic transducers 16a–16c and 18a–18c since the transducers are not yet attached. The final attachment of the piezoelectric ceramic transducers 16a–16c and 18a–18c to the inside of the tubular envelope 14 takes place in a furnace at 230° C. which is carefully controlled to preserve the electrical piezoelectric ceramic transducers 16a–16c and 18a–18c and the mechanical integrity of the tubular envelope 14 (e.g., cracking).

Figure 3:
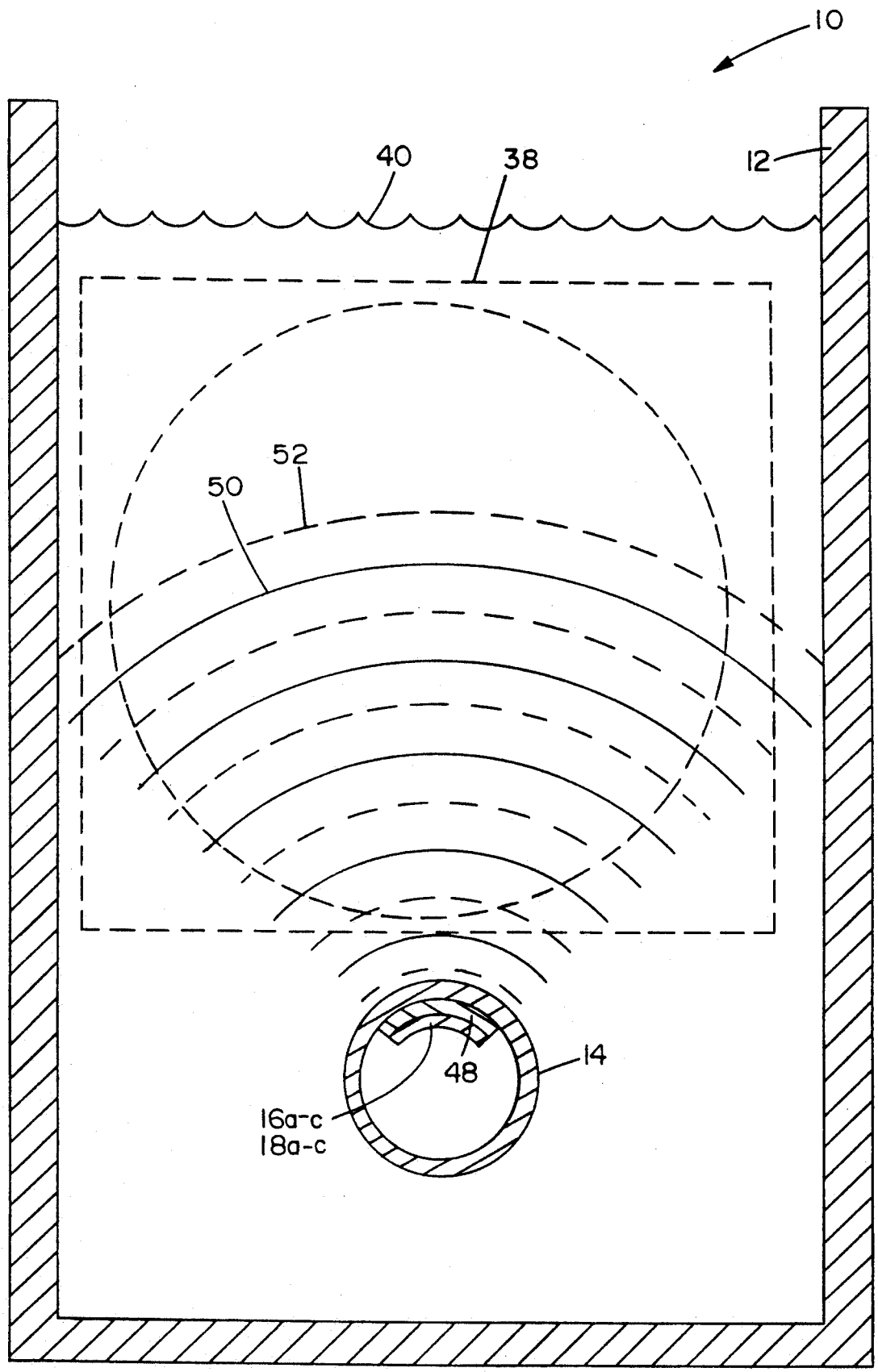
FIG. 3 illustrates an end view of the megasonic cleaner in cross section.

FIG. 3 illustrates an end view of the megasonic cleaner 10 in cross section where all numerals correspond to those elements previously described. The piezoelectric transducers provide a method of producing diverging longitudinal sound waves without the use of lenses or reflectors is now described. The present invention includes a cylindrically shaped transducer including piezoelectric ceramic transducers 16a–16c and 18a–18c to radiate the longitudinal wave in a diverging cylindrical shape illustrated by megasonic waves 50 and 52. The divergence angle is naturally determined by the degree of arc used in the piezoelectric ceramic transducers 16a–16c and 18a–18c. The piezoelectric ceramic transducers 16a–16c and 18a–18c are formed or ground into a cylindrically shaped piece, measuring approximately 90° of an arc, and then fired, metalized and electrically "poled" or oriented into a radial direction for its intended use. Different shapes are naturally made for the sonar field, and not for use in this physical work of the megasonics application until modified according to the teachings of this patent. A radiation pattern of a formed 90° angle is used in this megasonics application, and cover a wafer cassette 38, including a plurality of wafers as shown in the illustration. The piezoelectric ceramic transducers 16a–16c and 18a–18c produce a wave length of 1.5 MHZ as illustrated by megasonic wave 50, and piezoelectric ceramic transducers 16a–16c and 18a–18c can also produce a wave length of 0.75 MHZ when excited at a higher frequency as illustrated by the megasonic wave 52. By using sapphire, an inert tubular envelope 14 for the megasonic transducer 10 can be formed via a metalization technique, which can be used to transmit megasonic frequency energy to virtually all semiconductor cleaning fluids such as HF, HCL, NH$_4$OH, HNO$_3$, H$_2$SO$_4$ and others.

Figure 4:
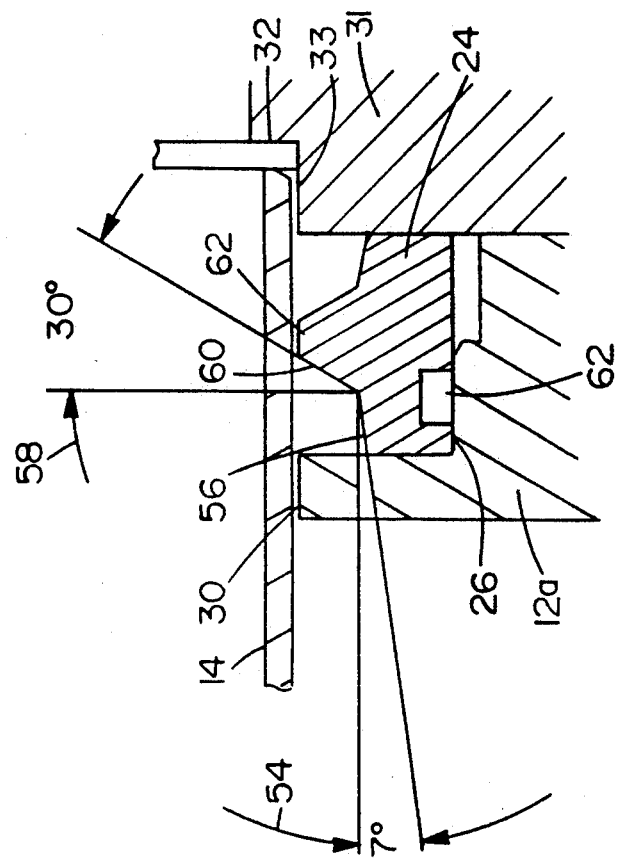
FIG. 4 illustrates a side view in cross section of the angled mounting collar; and, FIG. 5 illustrates a side view in cross section of the sealing assembly.
Figure 5:
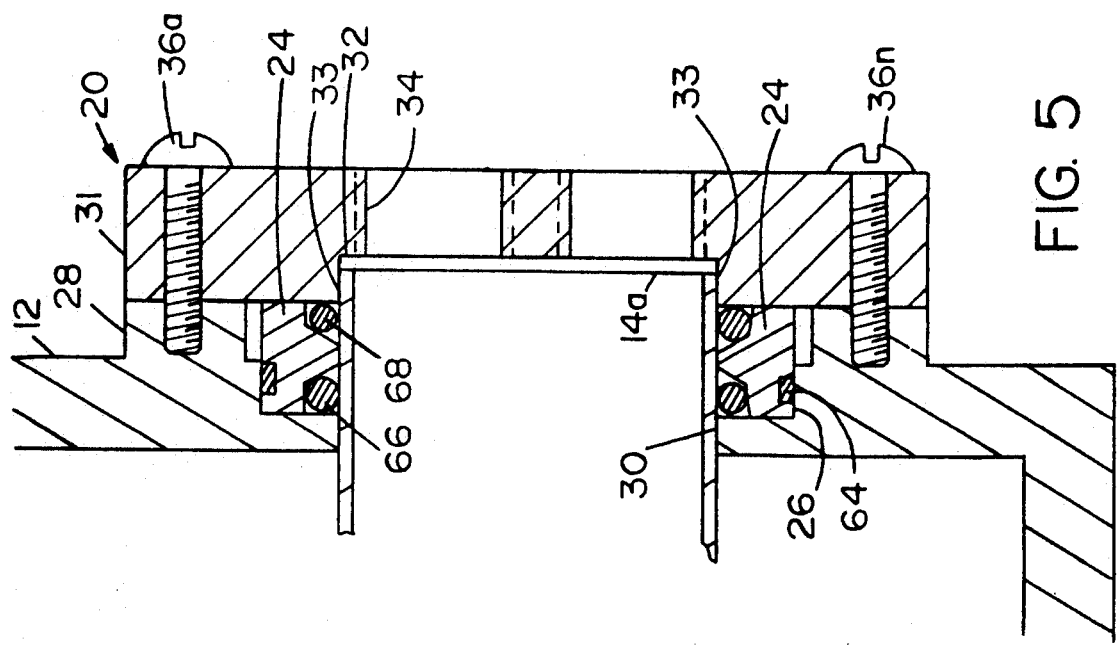

FIG. 4 illustrates a side view in cross section of the angled mounting collar 24 where all numerals correspond to those elements previously described. The annular angled mounting collar 24 includes an angle 54 of 7° angled between a surface 56, and a horizontal angle 58 of 30° between surface 60 and the vertical which equals a total included angle of 127° between the surfaces 56 and 60. An O-ring fits between the surfaces 56 and 60, the tubular envelope 14 and the bottom of the recess 26 as illustrated in FIG. 5. The corresponding angles on the other side of the annular ridge are the same as just described. An annular groove 62 accommodates a seal 64 as illustrated in FIG. 5. The angles 54 and 58 are described as 7' and 30', but may be any appropriate angle as desired to promote sealing of the O-rings. The recited are not to be construed as limiting of the scope of the present invention.

MODE OF OPERATION

The method of mounting the tubular envelope 14 in the process tank 12 accommodates the grown diameter of the envelope tube 14. This insures a simple assembly onto virtually any tank. The illustration of an O-ring sealing assembly shows how to mount the sapphire or quartz tubular envelope 14 through the tank 12. The angled mounting collar 24 squeezes the two O-rings 66 and 68 resulting in a radius reducing contact. Since a sapphire tubular envelope 14 is single crystal grown, and often varies by +/−0.01 inch, it is necessary to accommodate this variation with this non-standard O-ring squeeze technique.

FIG. 5 illustrates a side view in cross section of the sealing assembly 20 where all numerals correspond to those elements previously described. Illustrated in particular is the squeezing and positioning of the O-rings 66 and 68 by the angled mounting collar 24, thus effecting a seal for tubes of varying diameters. It is appreciated that O-rings of varying thicknesses can be used for accommodation of different sized envelope tubes 14, i.e., a smaller envelope tube 14 would require larger O-rings which would bridge the gap between the surfaces of the angled mounting collar 24 and the envelope tube 14, as well as the wall 12a.

Various modification can be made to the present invention without departing from the apparent scope hereof.

We claim:
1. A megasonic cleaning system comprising:
   a. a tank having two opposing sides, each side having a tube opening;
   b. a tube extending through the tank for mounting in the tube openings;
   c. the sides having a recess in each of the sides around the tube opening;
   d. a collar mounted in the recess around the tube opening in each side of said tank;
   e. an O'ring squeezed against the tube by the collar for sealing against leakage from the tank;
   f. a cap mounted on each side for holding the collar in place;
   g. the collar having an acute angled bearing surface for squeezing the O-ring against the tube for allowing for variation in thickness of the tube;
   h. first and second sets of piezoelectric transducers mounted in the tube; and, i. means for generating megasonic energy at a first frequency from the first set of transducers and a second frequency from the second set of transducers, the first frequency is generally twice the second frequency, and the first frequency is generally 1.5 megahertz and the second frequency is generally 0.75 megahertz.

2. A megasonic cleaning system comprising:
a. a tank having two opposing sides;
b. a tube extending through the tank and mounted through the opposing sides;
c. first and second arrays of piezoelectric transducers mounted within the tube for generating megasonic energy within the tank;
d. said arrays generate megasonic energy at a first frequency and at a second frequency, the first frequency is generally 1.5 megahertz and the second frequency is generally 0.75 megahertz;
e. collars for removably mounting the tube to the two opposing sides and for sealing against leakage;
f. a tube opening in each opposing side, each tube opening having an annular recess about said opening, said collar mounting in the recess;
g. an O'ring mounted in each recess for squeezing between the collar and the tube; and,
h. a cap mounted on each side for holding each collar in place, said collar having two opposing acute angled bearing surfaces for squeezing two O'rings against the tube, wherein the bearing system surfaces are angled to allow for variations in diameter of the tube.

* * * * *